United States Patent
Kim et al.

(10) Patent No.: US 9,397,150 B2
(45) Date of Patent: Jul. 19, 2016

(54) TOP EMISSION TYPE ORGANIC LIGHT EMITTING DISPLAY DEVICE AND METHOD OF MANUFACTURING THE SAME

(71) Applicant: LG Display Co., Ltd., Seoul (KR)

(72) Inventors: Binn Kim, Seoul (KR); JaeHee Park, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/575,066

(22) Filed: Dec. 18, 2014

(65) Prior Publication Data

US 2015/0187862 A1    Jul. 2, 2015

(30) Foreign Application Priority Data

Dec. 26, 2013    (KR) .................. 10-2013-0163799

(51) Int. Cl.
  *H01L 27/32*    (2006.01)
  *H01L 51/52*    (2006.01)
  *H01L 51/56*    (2006.01)

(52) U.S. Cl.
  CPC ........ *H01L 27/3276* (2013.01); *H01L 27/3248* (2013.01); *H01L 27/3272* (2013.01); *H01L 51/5253* (2013.01); *H01L 51/56* (2013.01)

(58) Field of Classification Search
  CPC .................. H01L 27/3276; H01L 27/3297
  See application file for complete search history.

(56) References Cited

U.S. PATENT DOCUMENTS

| | | | |
|---|---|---|---|
| 7,834,549 B2 | 11/2010 | Oh | |
| 2005/0117410 A1* | 6/2005 | Shin | G09G 3/325 365/189.09 |
| 2007/0194705 A1 | 8/2007 | Sung et al. | |
| 2009/0033597 A1* | 2/2009 | Sung | G09G 3/006 345/76 |
| 2009/0243470 A1 | 10/2009 | Chu et al. | |
| 2010/0201262 A1* | 8/2010 | Tamonoki | H01L 27/3272 313/505 |
| 2012/0139881 A1* | 6/2012 | Kwon | G09G 3/3677 345/204 |
| 2014/0332765 A1* | 11/2014 | Kim | H01L 51/56 257/40 |

FOREIGN PATENT DOCUMENTS

| | | |
|---|---|---|
| JP | 2010-085865 A | 4/2010 |
| KR | 10-2008-0105937 A | 12/2008 |
| KR | 10-2009-0103546 A | 10/2009 |

OTHER PUBLICATIONS

PCT International Search Report for PCT/KR2014/012744, Mar. 16, 2015, 3 Pages.

* cited by examiner

*Primary Examiner* — Michele Fan
(74) *Attorney, Agent, or Firm* — Fenwick & West LLP

(57) ABSTRACT

A top-emission type light emitting display device and a corresponding manufacturing method are described. A device substrate has display area and non-display areas. In the display area are formed: a thin film transistor including an active layer, a gate electrode, a source electrode, and a drain electrode; and an organic light emitting element including an anode, an organic light emitting layer, and a cathode. In the non-display area a second voltage supply wire is formed on, and overlaps with, a first voltage supply wire. An anti-burning layer is disposed between the first voltage and the second voltage supply wires. The anti-burning layer is an insulation layer with the same thickness as a space sufficient to suppress burning of the wires in the overlapping region between the first voltage supply wire and the second voltage supply wire, thus improving reliability and manufacturing yield of the device.

21 Claims, 10 Drawing Sheets

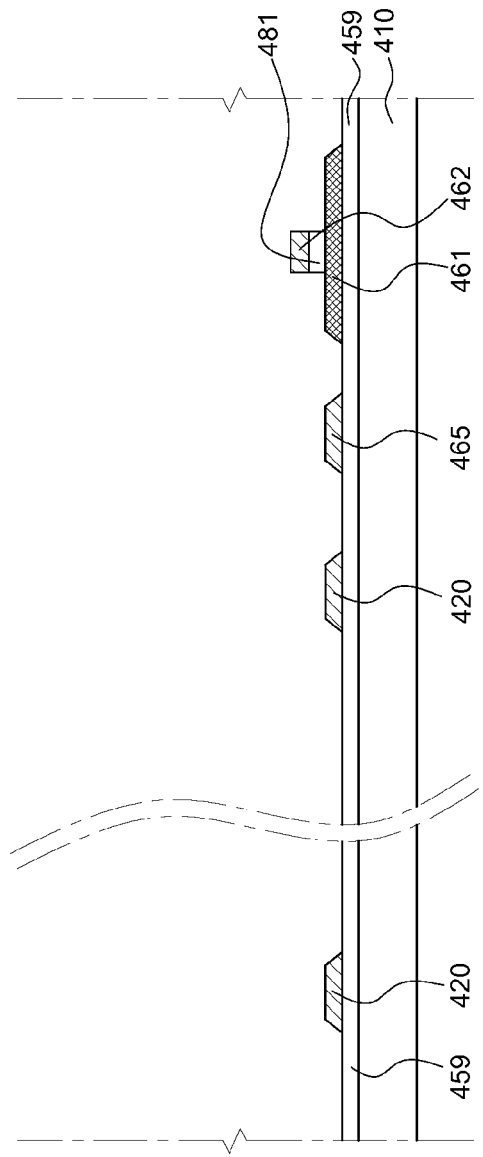

TOP EMISSION TYPE ORGANIC LIGHT EMITTING DISPLAY DEVICE AND METHOD OF MANUFACTURING THE SAME

CROSS-REFERENCE TO RELATED APPLICATIONS

This application claims the priority of Korean Patent Application No. 10-2013-0163799 filed on Dec. 26, 2013 in the Korean Intellectual Property Office, the disclosure of which is incorporated herein by reference.

BACKGROUND

1. Technical Field

The present disclosure relates to a top-emission type organic light emitting display device and a method of manufacturing the same, and more particularly, to a top-emission type organic light emitting display device with suppression of "burning failure" in voltage supply wires, and a method of manufacturing the same.

2. Description of the Related Art

Organic light emitting display devices as self-light emitting display devices can be manufactured in a light and thin type because there is no need for a separate light source, unlike liquid crystal displays. Further, the organic light emitting display devices have been studied as the next generation display, because they are advantageous not only in power consumption due to low driving voltage, but also in color rendering, response speed, viewing angles, and contrast ratio.

The organic light emitting display devices used at present fall into a top-emission type, a bottom emission type, and a double side emission type, depending on the emission direction.

SUMMARY

Various voltage supply wires are used in organic light emitting display devices. For example, the supply wires may include a Vss-voltage supply wire, a Vdd-voltage supply wire, a Vref-voltage supply wire and like. There are a larger number of light emitting elements to be driven in large organic light emitting devices in comparison to small organic light emitting display devices. Thus, when the voltage supply wires are mounted in top-emission type of large organic light emitting display devices, a large amount of current flows particularly through the Vss-voltage supply wire and the Vdd-voltage supply wire and hence a great amount of heat may be generated. Accordingly, it is preferable that the Vss-voltage supply wire and the Vdd-voltage supply wire are arranged without overlapping in order to prevent damage due to the heat from the Vss-voltage wire and the Vdd-voltage wire. However, a panel design in a limited space essentially leads to overlaps between the Vss-voltage supply wire and the Vdd-voltage supply wire.

When there is a foreign substance between the Vss-voltage supply wire and the Vdd-voltage supply wire in the overlapping region or when the Vss-voltage supply wire and the Vdd-voltage supply wire are not formed in desired arrangements in forming processes thereof, the Vss-voltage supply wire and the Vdd-voltage supply wire may form short-circuits. As described above, a considerable amount of current flows through the Vss-voltage supply wire and the Vdd-voltage supply wire. Thus, when the Vss-voltage supply wire and the Vdd-voltage supply wire are short-circuited, a large amount of heat is generated around the short-circuit. This heat may cause wires to melt and the organic light emitting device to degrade. Those phenomenon spreads from the short-circuit toward a surrounding region thereof and in turn the entire organic light emitting display device reaches lighting failure. This is called "burning failure".

The Vss-voltage supply wire used in a top-emission type organic light emitting display device is disposed and connected to a cathode in the peripheral region of a panel. In the top-emission type organic light emitting display device, a transparent electrode or a translucent electrode is used as the cathode to send upwardly the light from the organic light emitting layer. In both cases of the transparent electrode and a translucent electrode as the cathode, the cathode is formed thin to improve the transmission. However, the reduction in thickness of the cathode increases electrical resistance of the cathode. Accordingly, with the top-emission type organic light emitting display device, the luminance may not be uniform due to voltage drop increase as going further away from the voltage supply pad. The "voltage drop" used herein means a decrease in potential difference generated in the organic light emitting element, to be specific, a decrease in potential difference between the anode and the cathode of the organic light emitting element.

As mentioned above, voltage drop increases as going away from the voltage supply pad. Thus, when a Vss-voltage supply wire is disposed only in the peripheral region of the panel in large-sized top-emission type organic light emitting display devices, the voltage drop in the central region of the organic light emitting display devices is not efficiently suppressed. Accordingly, it is possible to efficiently suppress the voltage drop by disposing a Vss-voltage supply wire in a display area, in other words, the panel central region and also electrically connecting the cathode with the Vss-voltage supply wire in the display area. However, when a Vss-voltage supply wire is disposed in the display area, the overlap of the Vss-voltage supply wire and the Vdd-voltage supply wire increases as addressed above. Therefore, the possibility of the burning failure increases with the increase in overlap between the Vss-voltage supply wire and the Vdd-voltage supply wire in large-sized top-emission type organic light emitting display devices.

Therefore, the inventor(s) of the present disclosure has designed a new structure of voltage supply wires and/or an anti-burning layer to prevent burning due to short-circuits of the voltage supply wires in top-emission type organic light emitting display devices, particularly large-sized top-emission type organic light emitting display devices.

An object of the present disclosure is to provide a top-emission type organic light emitting display device with prevention of burning failure on a Vss-voltage supply wire and a Vdd-voltage supply wire via disposing of the Vss-voltage supply wire and the Vdd-voltage supply wire with a maximum vertical space therebetween, and a method of manufacturing the same.

Another object of the present disclosure is to provide a top-emission type organic light emitting display device having improved reliability and yield via suppression of burning failure with an anti-burning layer formed on the overlap between a Vss-voltage supply wire and a Vdd-voltage supply wire, and a method of manufacturing the same.

The objects of the present disclosure are not limited to those described above and other objects may be made apparent to those skilled in the art from the following description.

A top-emission type organic light emitting display device with a new anti-burning layer according to an exemplary embodiment of the present disclosure is provided. A substrate has a display area and a non-display area. A thin film transistor including an active layer, agate electrode, a source electrode, and a drain electrode, and an organic light emitting element including an anode, an organic light emitting layer, and a cathode are formed in the display area. A first voltage supply wire is formed in the non-display area and a second voltage supply wire on the non-display area is formed on the first voltage supply wire in the non-display area. The second voltage supply wire is disposed over the first voltage supply wire in the non-display area. The second voltage supply wire and the first voltage supply wire have at least one overlapping region. An anti-burning layer in the at least one overlapping region is disposed between the first voltage supply wire and the second voltage supply wire. The anti-burning layer is an insulation layer with a same thickness as a distance between the first voltage supply wire and the second voltage supply wire for preventing burning the at least one overlapping region. It is possible to secure a sufficient distance between the first voltage supply wire and the second voltage supply wire, using the anti-burning layer and to prevent burning at the overlap of the first voltage supply wire and the second voltage supply wire. Therefore, it is possible to improve reliability and yield of the top-emission type organic light emitting display device.

A top-emission type organic light emitting display device with a first voltage supply wire and a second voltage supply wire formed in a new arrangement structure according to an exemplary embodiment of the present disclosure is provided. A thin film transistor including an active layer, a gate electrode, a source electrode, and a drain electrode are formed in a display area. An organic light emitting element including an anode, an organic light emitting layer, and a cathode are formed in a display area of a substrate. A first voltage supply wire and a second voltage supply wire are formed in the display area and a non-display are of the substrate. The first voltage supply wire and the second voltage supply wire are disposed on different layers. The first voltage supply wire and the second voltage supply wire cross perpendicularly cross with a vertical gap disposed between them at a portion of the non-display area of the substrate. Since the first voltage supply wire and the second voltage supply wire are vertically spaced apart on different layers at the overlap of the first voltage supply wire and the second voltage supply wire, it is possible to prevent burning even if there is a foreign substance at the overlap of the first voltage supply wire and the second voltage supply wire.

A method of manufacturing a device of an exemplary embodiment of the present disclosure is provided. The method of manufacturing a top-emission type organic light emitting display device includes: forming a thin film transistor on a substrate, the thin film transistor including a gate electrode, a source electrode, a drain electrode, and an active layer; forming, during formation of the gate electrode, a Vss-voltage supply wire using a same material as the gate electrode of the thin film transistor; forming an organic light emitting element on the thin film transistor, the organic light emitting element including an anode, an organic light emitting layer, and a cathode; and forming, during the forming of the anode, a Vdd-voltage supply wire using a same material as the anode of the organic light emitting element. According to the method, it is possible to preclude burning that is generated when the Vss-voltage supply wire and the Vdd-voltage supply wire are short-circuited by foreign substances, in top-emission type organic light emitting display devices with a large area.

The details of other exemplary embodiments are included in the following detailed description and the accompanying drawings.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 4A to 4C are views illustrating the processes in the method of manufacturing the device of an exemplary embodiment of the present disclosure.

DETAILED DESCRIPTION

Figure 1A:
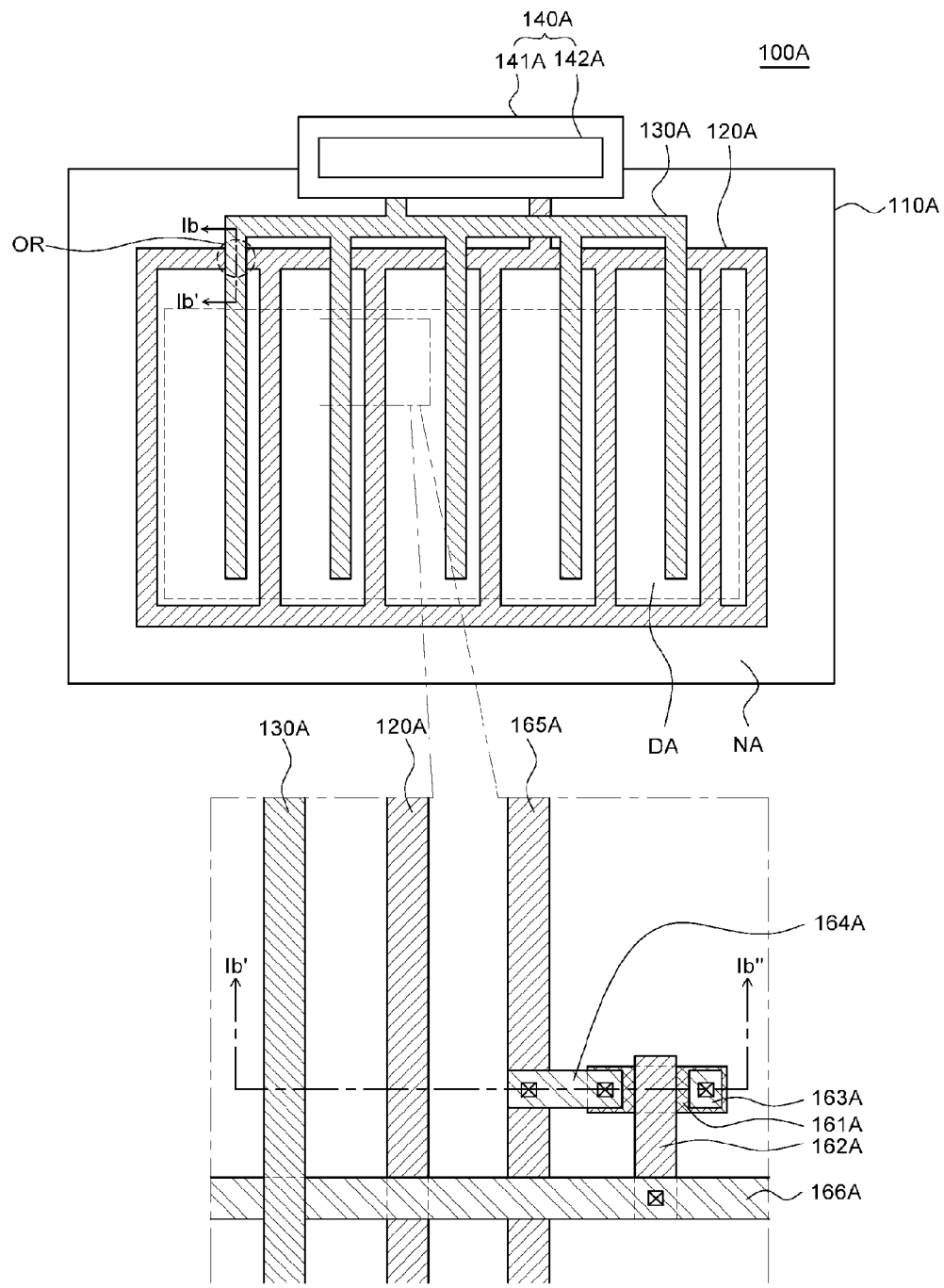
FIG. 1A is a schematic plan view and enlarged view illustrating a first voltage supply wire and a second voltage supply wire in a display area and a non-display area in a device of an exemplary embodiment of the present disclosure.

Various advantages and features of the present disclosure and methods accomplishing thereof will become apparent from the following description of embodiments with reference to the accompanying drawings. However, the present disclosure is not limited to the exemplary embodiments disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used in order to describe various components, the components are not limited by the terms. The above terms are used only to discriminate one component from the other component. Therefore, a first component mentioned below may be a second component within the technical spirit of the present disclosure.

The same reference numerals indicate the same elements throughout the specification.

In the drawings, size and thickness of each element are arbitrarily illustrated for convenience of illustration, and the present disclosure is not necessarily limited to those illustrated in the drawings.

The top-emission type organic light emitting display device described herein means an organic light emitting display device in which the light from an organic light emitting element travels outside through the top of the organic light emitting display device. The light from the organic light emitting element of the top-emission type organic light emitting display device travels to the top of the substrate with a thin film transistor for driving the organic light emitting display device.

Respective features of various exemplary embodiments of the present disclosure can be partially or totally joined or combined with each other and as sufficiently appreciated by those skilled in the art, various interworking or driving can be technologically achieved and the respective exemplary embodiments may be executed independently from each other or together executed through an association relationship.

Hereinafter, the present disclosure will be described in detail with reference to the attached drawings.

Figure 1B:
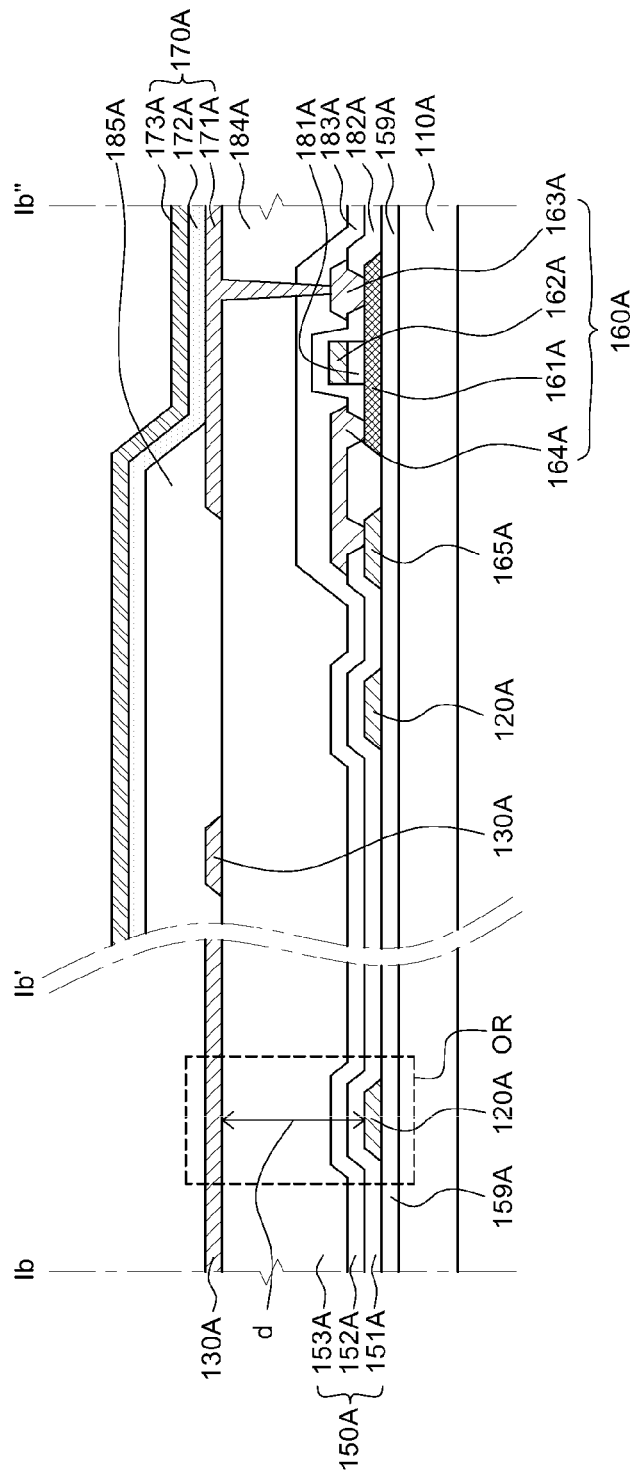
FIG. 1B is a cross-sectional view taken along line Ib-Ib'-Ib" of FIG. 1A for illustrating the relationship between an anti-burning layer between the first voltage supply wire and the second voltage supply wire and the elements in the display area in the top-emission type organic light emitting display device.

FIG. 1A is a schematic plan view and enlarged view illustrating a first voltage supply wire and a second voltage supply wire in a display area and a non-display area in a device of an exemplary embodiment of the present disclosure. FIG. 1B is a cross-sectional view taken along line Ib-Ib'-Ib" of FIG. 1A for illustrating the relationship between an anti-burning layer between the first voltage supply wire and the second voltage supply wire and the elements in the display area in the top-emission type organic light emitting display device. Referring to FIGS. 1A and 1B, a top-emission type organic light emitting display device 100A includes a substrate 110A, a thin film transistor 160A, an organic light emitting element 170A, a first voltage supply wire 120A, a second voltage supply wire 130A, an anti-burning layer 150A, and a driving package 140A. The first voltage supply wire 120A and the second voltage supply wire 130A are hatched in FIG. 1A for the convenience of illustration.

The substrate 110A has a display area DA and a non-display area NA. The display area DA is an area for displaying images, where various elements for displaying images are formed such as the thin film transistor 160A and the organic light emitting element 170A. The thin film transistor 160A includes an active layer 161A on a buffer layer 159A, a gate electrode 162A on a gate insulation layer 181A, and a source electrode 163A and a drain electrode 164A on an interlayer insulation layer 182A. On the thin film transistor 160A, there are formed a passivation layer 183A for protecting the thin film transistor 160A and an over-coating layer 184A for providing a planar cover for the thin film transistor 160A. The organic light emitting element 170A has an anode 171A in contact with the source electrode 163A via contact holes in the over-coating layer 184A and the passivation layer 183A, an organic light emitting layer 172A on the anode 171A, and a cathode 173A on the organic light emitting layer 172A. A bank layer 185A is formed on a side of the anode 171A. The thin film transistor 160A illustrated in FIG. 2B is an n-type transistor, and thus the source electrode 163A is in contact with the anode 171A. Otherwise, the thin film transistor 160A may be a p-type transistor, and, thus, the drain electrode 164A is in contact with the anode 171A. The non-display area NA is an area where an image is not displayed, in which there are formed a first voltage supply wire 120A, a second voltage supply wire 130A, and a driving package 140A for transmitting voltage and signals, etc to the various elements in the display area DA.

An insulation film 141A is connected to the non-display area NA of the substrate 110A. Wires for transmitting signals to the elements in the display area DA of the substrate 110A may be disposed on the insulation film 141A. The insulation film 141A may be made of a flexible material. A driving element 142A may be mounted on the insulation film 141A. The driving element 142A forms the driving package 140A such as a chip-on film (COF) together with the insulation film 141A. The driving element 142A is connected with the first voltage supply wire 120A, the second voltage supply wire 130A, and addition voltage supply wires on the insulation film 141A to send voltage and signals to the elements in the display area DA.

The first voltage supply wire 120A and the second voltage supply wire 130A are formed in the non-display area NA of the substrate 110A. The first voltage supply wire 120A and the second voltage supply wire 130A are connected with a wire on the insulation film 141A to transmit voltages and signals from the driving package 140A to the elements in the display area DA. The first voltage supply wire 120A is a Vss-voltage supply wire for transmitting Vss-voltage to the cathode of the organic light emitting element while the second voltage supply wire 130A is a Vdd-voltage supply wire for transmitting Vdd-voltage to the thin film transistor.

Referring to FIG. 1B, the first voltage supply wire 120A is formed on the buffer layer 159A on the substrate 110A. The buffer layer 159A provides a planar cover for the substrate 110A, and prevents moisture or impurities from invading the substrate 110A. The buffer layer 159A, however, is not a necessary but selective component, based on the kind of the substrate 110A or the kind of the thin film transistor in the top-emission type organic light emitting display device 100A.

Referring to FIGS. 1A and 1B, the second voltage supply wire 130A is formed over the first voltage supply wire 120A and overlaps the first voltage supply wire 120A. As described above, a large amount of current flows through the first voltage supply wire 120A as the Vss-voltage supply wire and the second voltage supply wire 130A as the Vdd-voltage supply wire. Thus, when there is a foreign substance between the first voltage supply wire 120A and the second voltage supply wire 130A in the overlap region OR there between, or the first voltage supply wire 120A and the second voltage supply wire 130A are not normally shaped, the first voltage supply wire 120A and the second voltage supply wire 130A may form short-circuits and burning failure may be generated accordingly. Further, although only small numbers of first voltage supply wire 120A and second voltage supply wire 130A are shown in FIG. 1A for the convenience of illustration, there are large numbers of first voltage supply wire 120A and second voltage supply wire 130A in actual products. In this case, the overlaps between the first voltage supply wire 120A and the second voltage supply wire 130A increase accordingly. In a consequence, the possibility of burning failure increases. Therefore, there is a need to prevent burning failure resulting from the first voltage supply wire 120A and the second voltage supply wire 130A to improve reliability and yield of the top-emission type organic light emitting display device 100A.

Referring to FIG. 1B, in order to ensure the distance $d_1$ between the first voltage supply wire 120A and the second voltage supply wire 130A to prevent burning of the first voltage supply wire 120A and the second voltage supply wire 130A, the top-emission type organic light emitting display device 100A of the present disclosure includes as the anti-burning layer 150A an insulation layer formed between the first voltage supply wire 120A and the second voltage supply wire 130A in the overlap region OR there between.

The anti-burning layer 150A includes a first insulation layer 151A made of the same material as the interlayer insulation layer 182A, a second insulation layer 152A made of the same material as the passivation layer 183A, and an over-coating layer 153A on the second insulation layer 152A. The first insulation layer 151A and the second insulation layer 152A are provided to electrically insulate the first voltage supply wire 120A and the second voltage supply wire 130A from each other. The first insulation layer 151A is formed along and on the surface of the underlying buffer layer 159A and on the surface of the first voltage supply wire 120A. The second insulation layer 152A is formed along and on the surface of the first insulation layer 151A. The first insulation layer 151A and the second insulation layer 152A may be made of silicon oxide film ($SiO_2$) or silicon nitride film ($SiNx$) or multi-layers thereof. However, the present disclosure is not limited thereto.

The over-coating layer 153A is formed on the second insulation layer 152A and provides a planar cover for the first voltage supply wire 120A. The over-coating layer 153A is made of a material to provide a planar cover for the first voltage supply wire 120A and high thermal resistance. The over-coating layer 153A may be made of any one or more of, for example, polyacrylates resin, epoxy resin, phenolic resin, polyamides resin, polyimides rein, unsaturated polyesters resin, poly-phenylenethers resin, poly-phenylenesulfides resin, and benzocyclobutene. As described above, a large amount of current flows through the first voltage supply wire 120A as the Vss-voltage supply wire and the second voltage supply wire 130A as the Vdd-voltage supply wire. Thus, a considerable amount of heat may be generated from the first voltage supply wire 120A and the second voltage supply wire 130A. Accordingly, when the anti-burning layer 150A is made of a conventional insulation layer material, the anti-burning layer 150A may be melted and, as a result, the first voltage supply wire 120A and the second voltage supply wire 130 may form a short-circuit. Thus, this results in burning failure. Therefore, in the top-emission type organic light emitting display device 100A according to an exemplary embodiment of the present disclosure, it is possible to prevent burning failure via using of the over-coating layer 153A made of a material to provide a planar cover for the first voltage supply wire 120A and high thermal resistance.

The anti-burning layer 150A is an insulation layer with the same thickness as the distance $d_1$ for preventing the burning of the first voltage supply wire 120A and the second voltage supply wire 130A. When the insulation layer between the first voltage supply wire 120A and the second voltage supply wire 130A is thin, the insulation layer may be damaged with foreign substances in between the first voltage supply wire 120A and the second voltage supply wire 130A to cause the short circuit there between. Accordingly, it is required to secure the sufficient distance $d_1$ between the first voltage supply wire 120A and the second voltage supply wire 130A to prevent the short circuit there between even when foreign substances invade in there between. Accordingly, in the top-emission type organic light emitting display device 100A according to an exemplary embodiment of the present disclosure, the anti-burning layer 150A may be employed with the same thickness as the distance $d_1$ for preventing the burning of the first voltage supply wire 120A and the second voltage supply wire 130A. Therefore, using the anti-burning layer 150A, the invasion of foreign substances may not be problematic and the short-circuit occurrence between the first voltage supply wire 120A and the second voltage supply wire 130A may be reduced. Further, the over-coating layer 153A of the burning layer 150A may be 4 μm or larger thick.

The first voltage supply wire 120A is made of the same material as a gate electrode 162A, that is, a conductive element closest to the substrate 110A, among the conductive elements in the display area DA. The second voltage supply wire 130A is made of the same material as an anode 171A on the over-coating layer 284A, among the conductive elements in the display area DA.

Referring to FIGS. 1A and 1B, a scan wire 166A and a data wire 165A are formed as the power supply wires. Although not illustrated in FIG. 1A for the convenience of illustration, the data wire 165A may be electrically connected with the driving package 140A or a separate data driver to transmit data signals to the thin film transistor 160A, and the scan wire 166A may be electrically connected with the driving package 140A or a separate GIP to transmit scan signals to the thin film transistor 160A. The data wire 165A is made of the same material as the gate electrode 162A and is electrically connected with the drain electrode 164A of the thin film transistor 160A. As the thin film transistor 160A illustrated in FIG. 1B is an n-type transistor, the drain electrode 164A is electrically connected with the data wire 165A. Otherwise, when the thin film transistor is a p-type transistor, the source electrode 163A is electrically connected with the data wire 165A.

The scan wire 166A is made of the same material as the source electrode 163A and the drain electrode 164A and is electrically connected with the gate electrode 162A of the thin film transistor.

Although, with reference to FIGS. 1A and 1B, the first voltage supply wire 120A is the Vss-voltage supply wire and the second voltage supply wire 130A is the Vdd-voltage supply wire, the first voltage supply wire 120A may be the Vdd-voltage supply wire and the second voltage supply wire 130A may be the Vss-voltage supply wire. That is, one of the first voltage supply wire 120A and the second voltage supply wire 130A may be the Vss-voltage supply wire and the other of the both may be the Vdd-voltage supply wire.

Although it was described with reference to FIGS. 1A and 1B that the first voltage supply wire 120A is made of the same material as the gate electrode 162A and the second voltage supply wire 130A is made of the same material as the anode 171A, the first voltage supply wire 120A may be made of the same material as the anode 171A and the second voltage supply wire 130A may be made of the same material as the gate electrode 162A. That is, one of the first voltage supply wire 120A and the second voltage supply wire 130A may be made of the same material as the gate electrode 162A and the other of the both may be made of the same material as the anode 171A.

Although the Vss-voltage supply wire, the Vdd-voltage supply wire, the data wire, and the scan wire are illustrated as the power supply wires in FIG. 1A, the top-emission type organic light emitting display device 100A may further include additional power supply wires such as a Vref-voltage supply wire.

Although only the first voltage supply wire 120A, the second voltage supply wire 130A, and the driving package 140A are illustrated in the non-display area NA of the substrate 110A in FIG. 1A, various further elements for transmitting voltages and signals to the elements in the display area DA may be additionally disposed in the non-display area NA of the substrate 110A. For example, a GIP (Gate In Panel), a data driver, and the like may be additionally disposed in the non-display area NA.

Although FIG. 1A illustrates the anti-burning layer 150A as having the first insulation layer 151A, the second insulation layer 152A, and the over-coating layer 153A in this order from the substrate 110A, such a stacking order may vary.

Although the anti-burning layer 150A illustrated in FIG. 1A includes the first insulation layer 151A, the second insulation layer 152A, and the over-coating layer 153A, the anti-burning layer 150A may include at least the over-coating layer 153A or include one or more of the first insulation layer 151A, the second insulation layer 152A, and the over-coating layer 153A.

Although the anode 171A is shown as a single layer in FIG. 1B for the convenience of illustration, this present disclosure is not limited thereto. When the organic light emitting display device according to an exemplary embodiment of the present disclosure is the top-emission type organic light emitting display device 100A, the anode 171A may include a reflecting layer for reflecting upwardly light from an organic light emitting layer 172A and a transparent conductive layer on the reflecting layer to supply holes to the organic light emitting layer 172A.

Figure 1C:
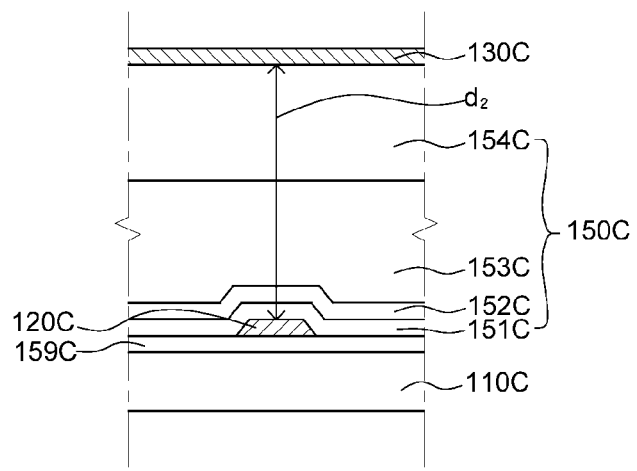
FIG. 1C is a cross-sectional view illustrating an anti-burning layer with a structure different from that of FIG. 1B in the device of an exemplary embodiment of the present disclosure.

FIG. 1C is a cross-sectional view illustrating an anti-burning layer with a structure different from that of FIG. 1B in the device of an exemplary embodiment of the present disclosure. The anti-burning layer 150C illustrated in FIG. 1C is different from the anti-burning layer 150A described with reference to FIG. 1B in that the layer 150C further includes an additional over-coating layer 154C. The configurations other than the additional layer 154C are substantially the same as mentioned above and thus descriptions thereof may be omitted.

Referring to FIG. 1C, an insulation layer, as the anti-burning layer 150C, for securing the distance $d_2$ between a first voltage supply wire 120C and a second voltage supply wire 130C to prevent the burning of the first voltage supply wire 120A and the second voltage supply wire 130C may include a first insulation layer 151C, a second insulation layer 152C on the first insulation layer 151C, an over-coating layer 153C on the second insulation layer 152C, and an additional over-coating layer 154C on the over-coating layer 153C.

The additional over-coating layer 154c is made of a material to provide a planar cover for the substrate 110C and high thermal resistance. The additional over-coating layer 153C may be made of any one or more of, for example, polyacrylates resin, epoxy resin, phenolic resin, polyamides resin, polyimides rein, unsaturated polyesters resin, poly-phenylenethers resin, poly-phenylenesulfides resin, and benzocyclobutene. The additional over-coating layer 154C may be made of the same material as the over-coating layer 153C. Since the anti-burning layer 150C further includes the additional over-coating layer 154C, the amount of the material with high thermal resistance and the thickness of the anti-burning layer 150C increase. In this manner, the burning failure can be further suppressed.

The anti-burning layer 150C illustrated in FIG. 1C can secure the sufficient distance $d_2$ for preventing the burning of the first voltage supply wire 120C and the second voltage supply wire 130C. Using this configuration, the distance may be 8 µm or more and the thickness of the additional over-coating layer 154C of the anti-burning layer 150C may be substantially the same as that of the over-coating layer 153C.

Figure 2A:
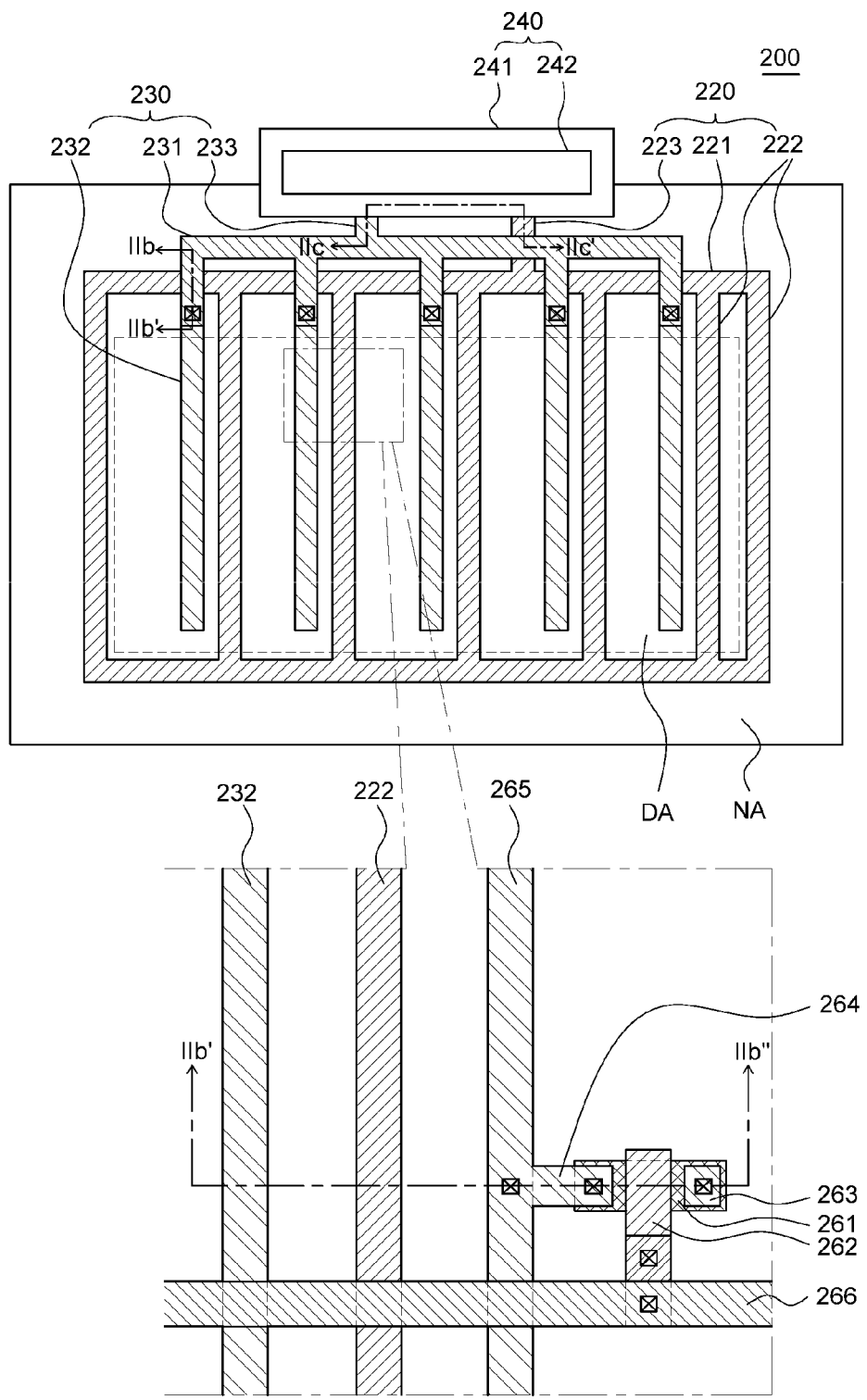
FIG. 2A is a schematic plan view and enlarged view illustrating a first voltage supply wire, a second voltage supply wire, and a display area, which are formed in a structure different from that of FIG. 1A, in a display area and a non-display area in a device of an exemplary embodiment of the present disclosure.
Figure 2B:
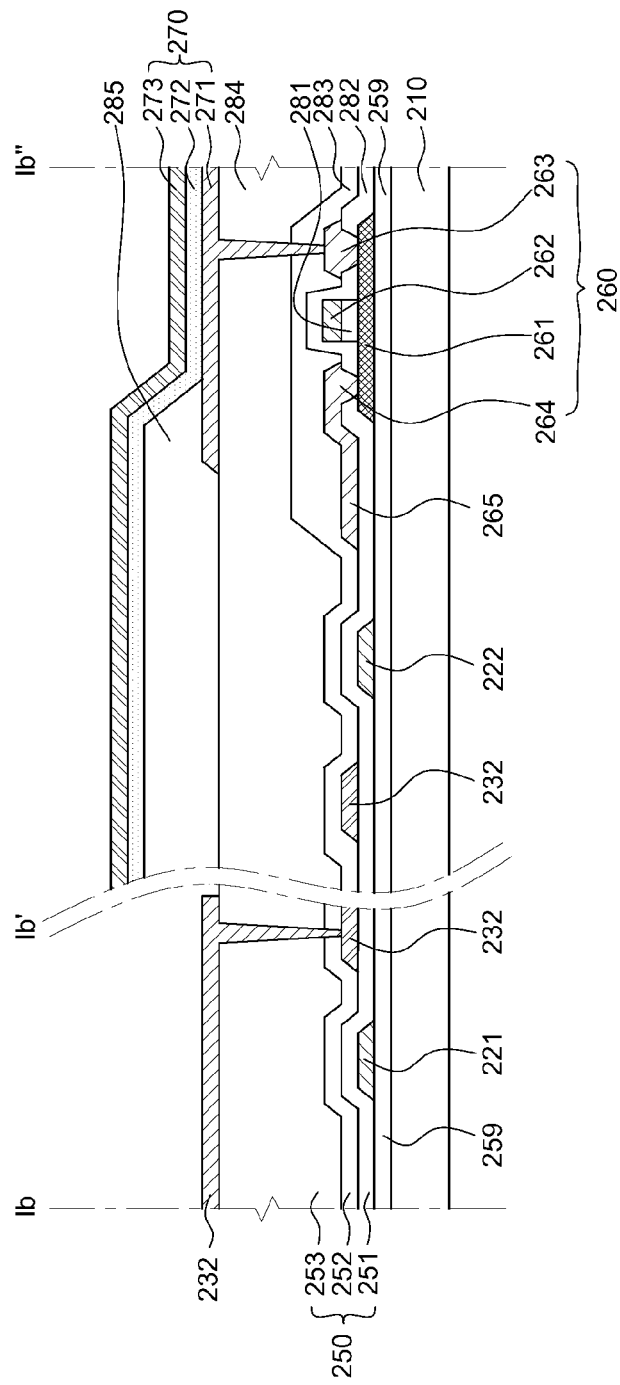
FIG. 2B is a cross-sectional view taken along line IIb-IIb'-IIb" of FIG. 2A for illustrating the relationship among the first voltage supply wire, the second voltage supply wire, and the elements in the display area in the top-emission type organic light emitting display device.

FIG. 2A is a schematic plan view and enlarged view illustrating a first voltage supply wire, a second voltage supply wire, and a display area, which have structures different from that of FIG. 1A, in a device of an exemplary embodiment of the present disclosure. FIG. 2B is a cross-sectional view taken along line IIb-IIb'-IIb" of FIG. 2A for illustrating the relationship among the first voltage supply wire, the second voltage supply wire, and the elements in the display area in the top-emission type organic light emitting display device. Referring to FIGS. 2A and 2B, a top-emission type organic light emitting display device 200 includes a substrate 210, a thin film transistor 260, an organic light emitting element 270, a first voltage supply wire 220, a second voltage supply wire 230, an anti-burning layer 250, and a driving package 240. The substrate 210, anti-burning layer 250, and driving package 240 illustrated in FIGS. 2A and 2B are substantially the same as the substrate 110A, anti-burning layer 150A, and driving package 140A illustrated in FIG. 1A. Thus, the description thereof may not be set forth. The first voltage supply wire 220 and the second voltage supply wire 230 are hatched in FIG. 2A for the convenience of illustration.

The first voltage supply wire 220 and the second voltage supply wire 230 are formed in a display area DA and a non-display area NA of the substrate 210. The first voltage supply wire 220 is a Vss-voltage supply wire for transmitting Vss-voltage to the cathode 273 of the organic light emitting element 270 while the second voltage supply wire 230 is a Vdd-voltage supply wire for transmitting Vdd-voltage to the thin film transistor 260.

The first voltage supply wire 220 includes a stem wire 221, one or more branch wires 222 branched from the stem wire 221, and a connection wire 223 electrically connected with the pad to electrically connect the stem wire 221 and the driving package 240 each other. The stem wire 221 and the connection wire 223 of the first voltage supply wire 220 are formed in the non-display area NA of the substrate 210 and the branch wires 222 of the first voltage supply wire 220 extends from the stem wire 221 into the display area DA of the substrate 210.

The first voltage supply wire 220 is made of only the same material as a gate electrode 262, that is, a conductive element closest to the substrate 210 among various conductive elements in the display area DA. To be specific, the stem wire 221, branch wires 222, and connection wire 223 of the first voltage supply wire 220 are all made of only the same material as the gate electrode 262. The gate electrode 262 may be formed of any one of Mo, Al, Cr, Au, Ti, Ni, Nd, and Cu, or an alloy thereof. However, the gate electrode is not limited thereto and may be formed of various materials.

The second voltage supply wire 230 similar to the first voltage supply wire 220 includes a stem wire 231, one or more branch wires 232 branched from the stem wire 231, and a connection wire 233 electrically connected with the pad to electrically connect the stem wire 231 and the driving package 240 each other. The stem wire 231 and the connection wire 233 of the second voltage supply wire 230 are formed in the non-display area NA of the substrate 210 while the branch wire 232 of the second voltage supply wire 232 extends into the display area DA of the substrate 210 from the stem wire 231. The second voltage supply wire 230 has a first portion made of the same material as the anode 271 on an over-coating layer 284 and a second portion made of the same material as the source 263 and the drain electrode 264 among the conductive elements in the display area DA. To be specific, referring to FIG. 2A, the stem wire 231 and the connection wire 233 of the second voltage supply wire 230 are made of the same material as the anode 271 while the branch wires 232 has a first portion made of the same material as the anode 271 and a second portion made of the same material as the source electrode 263 and the drain electrode 264. The first portion and the second portion respectively form two layers in part of the non-display area NA. Such two layers are electrically connected to each other via a contact hole.

The first voltage supply wire 220 and the second voltage supply wire 230 overlaps with a vertical gap formed there between in parts of the non-display area NA. For example, referring to FIGS. 2A and 2B, the stem wire 221 of the first voltage supply wire 220 and the branch wires 232 of the second voltage supply wire 230 overlap with a vertical gap formed there between in the non-display area NA. In the overlap region, the stem wire 221 of the first voltage supply wire 220 is made of the same material as the gate electrode 262 and the branch wire 232 of the second voltage supply wire 230 is made of the same material as the anode 271. Referring to FIG. 2A, the connection wire 223 of the first voltage supply wire 220 made of the same material as the gate electrode 262 and the stem wire 231 of the second voltage supply wire 230 made of the same material as the anode 271 overlaps with a vertical gap formed there between in the non-display area NA. Therefore, the first voltage supply wire 220 and the second voltage supply wire 230 may overlap with a vertical gap formed there between at parts of the non-display area NA in the top-emission type organic light emitting display device 200 according to an exemplary embodiment of the present disclosure. In this way, burning failure may be suppressed in the first voltage supply wire 220 and the second voltage supply wire 230. Further, in the overlap region between the first voltage supply wire 220 and the second voltage supply wire 230, the first voltage supply wire 220 is made of the same material as the gate electrode 262, that is, the conductive element closest to the substrate 210 in the display area DA, and the second voltage supply wire 230 is made of the same material as the anode 271 on the over-coating layer 284. Thus, the sufficient distance can be secured between the first voltage supply wire 220 and the second voltage supply wire 230.

The first voltage supply wire 220 and the second voltage supply wire 230 may be made of the materials described above. At this case, a scan wire 266 is made of the same material as the anode 271 and is electrically connected with the gate electrode 262, and a data wire 265 is made of the same material as the source electrode 263 and the drain electrode 264 and is electrically connected with the source electrode 263. Accordingly, the scan wire 266 and the data wire 265 may be made of different materials.

Referring to FIG. 2B, the anti-burning layer 250 includes a first insulation layer 251, a second insulation layer 252, and an over-coating layer 253. The anti-burning layer 250 includes the over-coating layer 253 made of a material with high thermal resistance and further secures a sufficient distance to prevent the burning of the first voltage supply wire 220 and the second voltage supply wire 230. In this fashion, there may be achieved prevention of burning in the top-emission type organic light emitting display device 200.

Although it was described with reference to FIGS. 2A and 2B that the first voltage supply wire 220 is the Vss-voltage supply wire and the second voltage supply wire 230 is the Vdd-voltage supply wire, the first voltage supply wire 220 may be the Vdd-voltage supply wire and the second voltage supply wire 230 may be the Vss-voltage supply wire. That is, any one of the first voltage supply wire 220 and the second voltage supply wire 230 is the Vss-voltage supply wire and the other is the Vdd-voltage supply wire.

Although the first voltage supply wire 220 illustrated in FIGS. 2A and 2B is made of the same material as the gate electrode 262, the first voltage supply wire 220 may be made of the same material as the anode 271. That is, the first voltage supply wire may be made of the same material as anyone of the gate electrode 262 and the anode 271.

Although the second voltage supply wire 230 has the portion made of the same material as the anode 271 and the portion made of the same material as the source electrode 263 and the drain electrode 264 in FIGS. 2A and 2B, the second voltage supply wire 230 may have a portion made of the same material as the gate electrode 262 and a portion made of the source electrode 263 and the drain electrode 264. That is, the second voltage supply wire 230 may have a portion made of the same material as any one of the gate electrode 262 and the anode 271 and a portion made of the same material as the source electrode 263 and the drain electrode 264.

Although the branch wire 222 of the first voltage supply wire 220 vertically diverges from the stem wire 221 and the branch wire 232 of the second voltage supply wire 230 vertically diverges from the stem wire 232 in FIG. 2A, the branch wire 222 and the stem wire 221 of the first voltage supply wire 220 and the branch wire 232 and the stem wire 231 of the second voltage supply wire 230 may extend in other selective directions.

Although the portion where the branch electrode 222 and the cathode electrode 273 of the first voltage supply wire 220 that is the Vss-voltage supply wire are connected is not illustrated in FIG. 2B for the convenience of illustration, the first voltage supply wire 220 and the cathode 273 may be electrically connected in various ways.

Figure 2C:
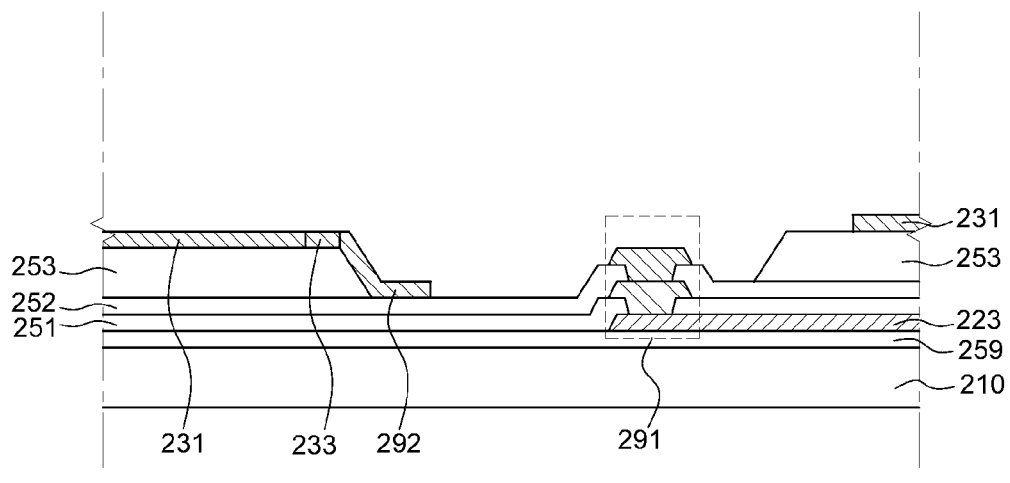
FIG. 2C is a cross-sectional view taken along line IIc-IIc' of FIG. 2A for illustrating a pad of the top-emission type organic light emitting display device.

FIG. 2C is a cross-sectional view taken along line IIc-IIc' of FIG. 2A for illustrating the pad of the top-emission type organic light emitting display device. In FIG. 2C, the driving package 240 is not illustrated for the convenience of illustration and only the elements on the substrate 210 are illustrated.

Referring to FIGS. 2A to 2C, the pad 290 includes a first pad 291 electrically connected with the first voltage supply wire 220 and a second pad 292 electrically connected with the second voltage supply wire 230. The first pad 291 and the second pad 292 are formed in a plurality of layers, and the top of the first pad 291 and the top of the second pad 292 may be made of the same material as the anode 271 and electrically connected with the wires of the driving package 240.

The first pad 291 has a portion made of the same material as the gate electrode 262, a portion made of the same material as the source electrode 263 and the drain electrode 264, and a portion made of the same material as the anode 271, and the portions form the layers of the first pad 291. Further, the layers of the first pad 291 include the first insulation layer 251 and the second insulation layer 252 of the anti-burning layer 250. They are electrically connected with the first voltage supply wire 220, in detail, the connection wire 223 of the first voltage supply wire 220. As described above, since the first voltage supply wire 220 has the portion made of the same material as the gate electrode 262, the portion made of the same material as the gate electrode 262 of the first pad 291 is in contact with the connection wire 223 of the first voltage supply wire 220.

The second pad 292 has a portion made of the same material as the anode 271. Further, the second pad 292 includes the first insulation layer 251 and the second insulation layer 252 of the anti-burning layer 250 and the portion made of the same material as the first insulation layer 251 and the second insulation layer 252, and the anode 271 of the anti-burning layer 250 forms a plurality of layers. They are electrically connected with the second voltage supply wire 230, in detail, the connection wire 233 of the second voltage supply wire 230. As described above, since the second voltage supply wire 230 has the portion made of the same material as the anode 271, the portion made of the same material as the anode 271 of the second pad 292 is in contact with the connection wire 233 of the second voltage supply wire 230.

Although the first pad 291 has the portion made of the same material as the gate electrode 262, the portion made of the same material as the source electrode 263 and the drain electrode 264, and the portion made of the same material as the anode 271 in FIG. 2C, the first pad 291 may have only the portion made of the same material as the gate electrode 262 and the portion made of the same material as the anode 271 and the portions may be electrically connected in direct contact with each other. Accordingly, the first pad 291 has at least the portion made of the same material as the anode 271 and the portion made of the same material as the gate electrode 262.

Figure 3:
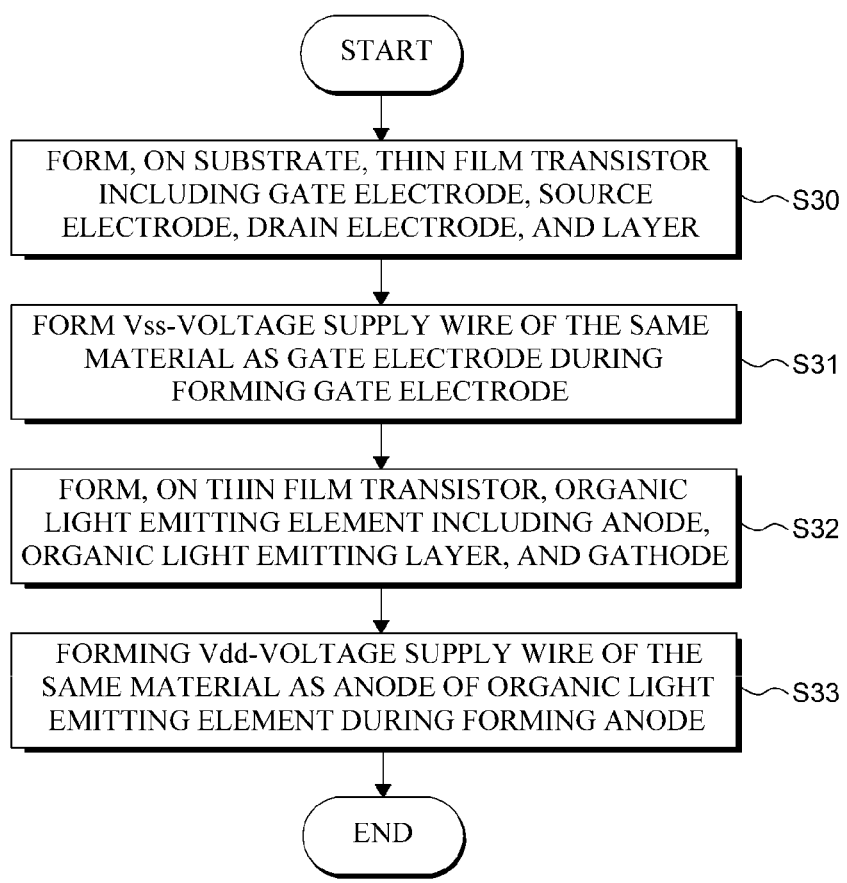
FIG. 3 is a flowchart illustrating a method of manufacturing the device of an exemplary embodiment of the present disclosure.
Figure 4B:
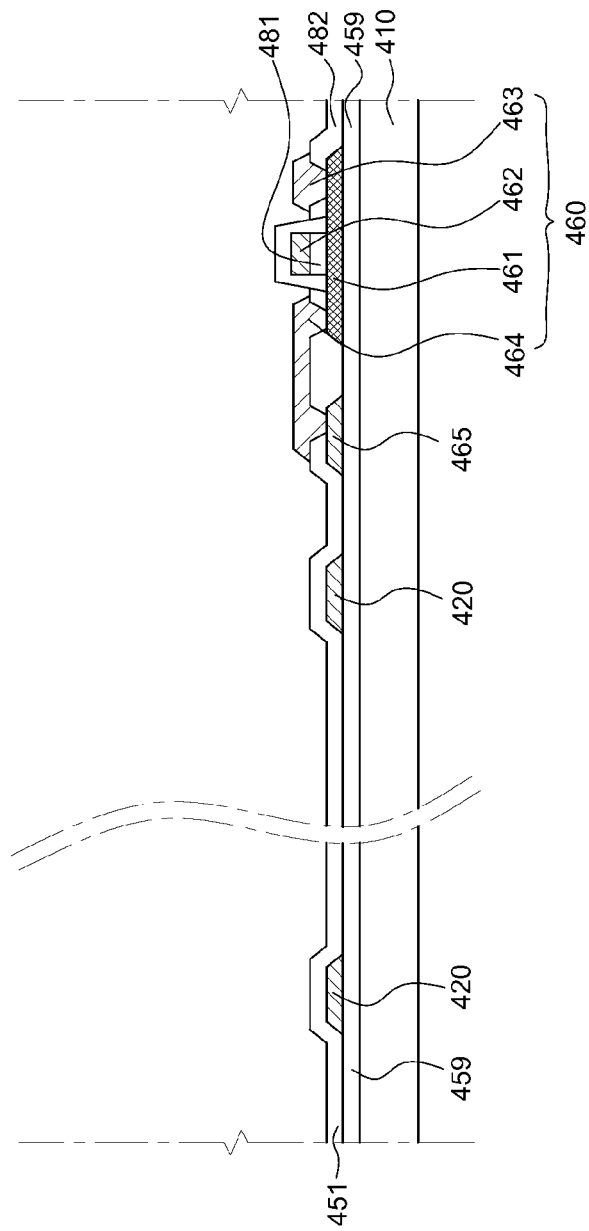
Figure 4C:
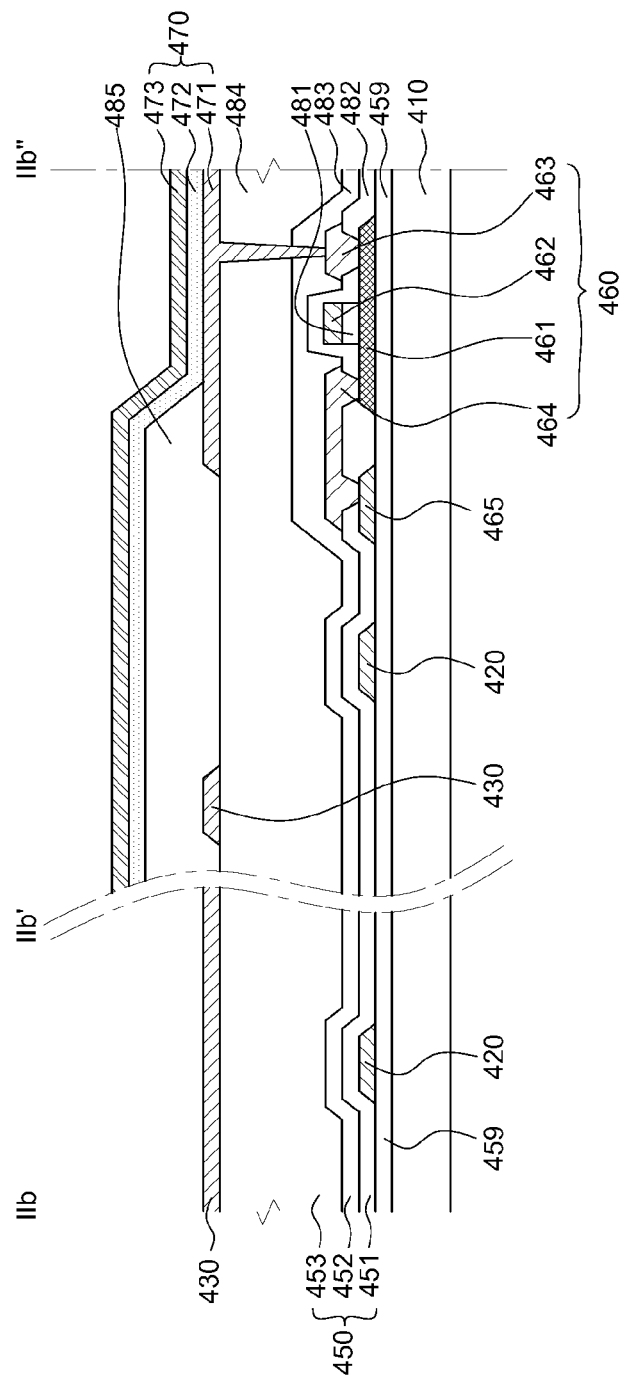

FIG. 3 is a flowchart illustrating a method of manufacturing the device of an exemplary embodiment of the present disclosure. FIGS. 4A to 4C are views illustrating the processes in the method of manufacturing the device of an exemplary embodiment of the present disclosure. Only the overlap of a first voltage supply wire 420 and a second voltage supply wire 430 (at the left side in the figures) and a display area DA (at the right side in the figures) in a top-emission type organic light emitting display device 400 are illustrated in FIGS. 4A to 4C. The elements illustrated in FIGS. 4A to 4C are substantially the same as those illustrated in FIG. 1B, so the overlapping description is not provided.

First, a thin film transistor 460 including a gate electrode 462, a source electrode 463, a drain electrode 464, and an active layer 461 are formed on a substrate 410 (S30) and a Vss-voltage supply wire that is the first voltage supply wire 420 is made of the same material as the gate electrode 462 of the thin film transistor 460 when the gate electrode 462 is formed (S31). The forming of the thin film transistor 460 and the Vss-voltage supply wire that is the first voltage supply wire 420 is described in more detail with reference to FIGS. 4A and 4B.

Referring FIG. 4A first, a buffer layer 459 is formed on the substrate 410, an active layer 461 is formed on the buffer layer 459, a gate insulation layer 481 is formed on the active layer 461, and the gate electrode 462 and the first voltage supply wire 420 made of only the same material as the gate electrode 462 are formed on the buffer layer 459. In order to simultaneously form the gate electrode 462 and the first voltage supply wire 420, the material for the gate electrode 462 is deposited on the entire surface of the substrate 410 and the material for the gate electrode 462 is patterned such only the portion corresponding to the gate electrode 462 and the portion corresponding to the first voltage supply wire 420 remain. Accordingly, the gate electrode 462 and the first voltage supply wire 420 can be simultaneously formed. Only a stem wire 421 at the overlap of the first voltage supply wire 420 and the second voltage supply wire 430 and a branch wire 422 in the display area DA, in the first voltage supply wire 420, are illustrated in FIG. 4A. Further, a data wire 465 made of the same material as the gate electrode 462 is formed simultaneously with the gate electrode 462.

Referring to FIG. 4B, an interlayer insulation layer 482 is deposited on the gate electrode 462 and the first voltage supply wire 420, over the entire surface of the substrate 410. Accordingly, when the interlayer insulation layer 482 is formed, the first insulation layer 451 of the anti-burning layer 450 formed on the first voltage supply wire 420, at the overlap of the first voltage supply wire 420 and the second voltage supply wire 430, can be made of the same material as the interlayer insulation layer 482 simultaneously with the interlayer insulation layer 482.

After the interlay insulation layer 482 is formed, a contact hole opening a portion of the active layer 461 and a contact hole opening a portion of the data wire 465 are formed, and the source electrode 463 that is in contact with the active layer 461 and the drain electrode 464 that is in contact with the active layer 461 and the data wire 465 are formed. Though not illustrated in FIG. 4B, a scan wire 466 made of the same material as the source electrode 463 and the drain electrode 464 may be formed, when the source electrode 463 and the drain electrode 464 are formed.

Thereafter, an organic light emitting element 470 including the anode 471, an organic light emitting layer 472, and a cathode 473 are formed on the thin film transistor 460 (S32), and a Vdd-voltage supply wire that is the second voltage supply wire 430 is made of the same material as the anode 471 of the organic light emitting element 470 when the anode 471 is formed (S33). The forming of the organic light emitting element 470 and the Vdd-voltage supply wire that is the second voltage supply wire 430 is described in more detail with reference to FIG. 4C.

Referring to FIG. 4C, a passivation layer 483 is deposited on the source electrode 463 and the drain electrode 464, over the entire surface of the substrate 410. Accordingly, when the passivation layer 483 is formed, the second insulation layer 452 of the anti-burning layer 450 formed on the first voltage supply wire 420, at the overlap of the first voltage supply wire 420 and the second voltage supply wire 430, can be made of the same material as the passivation layer 483 simultaneously with the passivation layer 483.

Thereafter, an over-coating layer 484 is deposited on the passivation layer 483 over the entire surface of the substrate 410. Accordingly, the over-coating layer 453 of the anti-burning layer 450 formed on the first voltage supply wire 420, at the overlap of the first voltage supply wire 420 and the second voltage supply wire 430, can be made of the same material as the over-coating layer 484 in the display area DA, simultaneously when the over-coating layer 484 is formed in the display area DA.

After the passivation layer 483 and the over-coating layer 484 are formed, a contact hole opening a portion of the source electrode 463 is formed through the passivation layer 483 and the over-coating layer 484.

Thereafter, the anode 471 that is in contact with the source electrode 463 and the second voltage supply wire 430 made of only the same material as the anode 471 are formed on the over-coating layer 453. In order to simultaneously form the anode 471 and the second voltage supply wire 430, the material for the anode 471 is deposited on the entire surface of the substrate 410 and the material for the anode 471 is patterned such only the portion corresponding to the anode 471 and the portion corresponding to the second voltage supply wire 430 remain. Accordingly, the anode 471 and the second voltage supply wire 430 can be simultaneously formed. Only the overlap of the first voltage supply wire 420 and the second voltage supply wire 430 and the branch wire 432 in the display area DA, in the second voltage supply wire 430, are illustrated in FIG. 4C.

Next, a bank layer 485 covering a side of the anode 471 is formed, the organic light emitting layer 472 formed, and the cathode 473 is formed on the organic light emitting layer 472.

Although the first insulation layer 451, second insulation layer 452, and over-coating layer 453 of the anti-burning layer 450 are made of the same material as the interlayer insulation layer 482, passivation layer 483, and over-coating layer 484 in the display area DA simultaneously with them in FIGS. 4A to 4C, the anti-burning layer 450, the interlayer insulation layer 482, the passivation layer 483, and the over-coating layer 484 may be independently formed.

Hereinafter, various features of a top-emission type organic light emitting display device having a new anti-burning layer according to an embodiment of the present disclosure will be described.

According to another feature of the present disclosure, one of the first voltage supply wire and the second voltage supply wire is a Vss-voltage supply wire and the other one of the first voltage supply wire and the second voltage supply wire is a Vdd-voltage supply wire.

According to still another feature of the present disclosure, one of the first voltage supply wire and the second voltage supply wire is made of the same material as the gate electrode and the other one of the first voltage supply wire and the second voltage supply wire is made of a same material as the anode.

According to still another feature of the present disclosure, the distance between the first voltage supply wire and the second voltage supply wire is 4 µm or larger.

According to still another feature of the present disclosure, the anti-burning layer includes one or more of a first insulation layer made of a same material as an interlayer insulation layer, a second insulation layer made of a same material as a passivation layer, and an over-coating layer to provide a planar cover for the first voltage supply wire.

According to still another feature of the present disclosure, the over-coating layer is made of one or more of polyacrylate resin, epoxy resin, phenolic resin, polyamide resin, polyimide resin, unsaturated polyesters resin, poly-phenylenether resin, poly-phenylenesulfide resin, and benzocyclobutene.

According to still another feature of the present disclosure, the over-coating layer is a first over-coating layer, wherein the anti-burning layer further comprises a second over-coating layer formed between the first over-coating layer and the second voltage supply wire, the second over-coating layer made of a same material as the first over-coating layer.

Hereinafter, various features of a top-emission type organic light emitting display device having a first voltage supply wire and a second voltage supply wire which are formed in a new arrangement structure according to an embodiment of the present disclosure will be described.

According to another feature of the present disclosure, one of the first voltage supply wire and the second voltage supply wire is a Vss-voltage supply wire and the other one of the first voltage supply wire and the second voltage supply wire is a Vdd-voltage supply wire.

According to still another feature of the present disclosure, the Vss-voltage supply wire is made of a same material as one of the gate electrode and the anode.

According to still another feature of the present disclosure, the Vdd-voltage supply wire has a first portion made of a same material as one of the gate electrode and the anode, and a second portion made of a same material as the source electrode and the drain electrode.

According to still another feature of the present disclosure, Vdd-voltage supply wire has two layers respectively made of different materials in a part of the non-display area, wherein the two layers are electrically connected to each other via a contact hole.

According to still another feature of the present disclosure, the top-emission type organic light emitting display device further comprises a scan wire on the display area, the scan wire electrically connected with the gate electrode; and a data wire electrically connected with one of the source electrode and the drain electrode, wherein the scan wire is made of a material different from the data wire, and the data wire is made of the same material as the source electrode and the drain electrode.

According to still another feature of the present disclosure, the top-emission type organic light emitting display device further comprises a pad including a first pad unit electrically connected with the first voltage supply wire and a second pad unit electrically connected with the second voltage supply wire, wherein each of the first pad unit and the second pad unit has a plurality of stacked layers, wherein an uppermost layer of the stacked layers of the first pad unit and an uppermost layer of the stacked layer of the second pad unit are made of a same material as the anode.

According to still another feature of the present disclosure, each of the first voltage supply wire and the second voltage supply wire comprises a stem wire, one or more branch wires branched from the stem wire, and a connection wire electrically connecting the stem wire and the pad.

According to still another feature of the present disclosure, each of the stem wires of the first and second voltage supply wires is formed in the non-display area, and the branch wires of the first voltage supply wire and the branch wires of the second voltage supply wire are formed in both of the display area and the non-display area.

According to still another feature of the present disclosure, the stem wire of the first voltage supply wire overlaps the branch wires of the second voltage supply wire.

Hereinafter, various features of a method of manufacturing a device of an embodiment of the present disclosure will be described.

According to another feature of the present disclosure, the method of manufacturing a top-emission type organic light emitting display device further comprises forming a scan wire, the scan wire electrically connected with the gate electrode and made of a same material as the source electrode and the drain electrode; and forming a data wire, the data wire electrically connected with one of the source electrode and the drain electrode and made of the same material as the gate electrode.

According to still another feature of the present disclosure, the method of manufacturing a top-emission type organic light emitting display device further comprises forming an anti-burning layer in an overlap region between the Vss-voltage supply wire and the Vdd-voltage supply wire.

According to still another feature of the present disclosure, the anti-burning layer has, in order, a first insulation layer made of a same material as an interlayer insulation layer, a second insulation layer made of a same material as a passivation layer and an over-coating.

The present disclosure has been described in more detail with reference to the exemplary embodiments, but the present disclosure is not limited to the exemplary embodiments. It will be apparent to those skilled in the art that various modifications can be made without departing from the technical sprit of the present disclosure. Accordingly, the exemplary embodiments disclosed in the present disclosure are used not to limit but to describe the technical spirit of the present disclosure, and the technical spirit of the present disclosure is not limited to the exemplary embodiments. Therefore, the exemplary embodiments described above are considered in all respects to be illustrative and not restrictive. The protection scope of the present disclosure must be interpreted by the appended claims and it should be interpreted that all technical spirits within a scope equivalent thereto are included in the appended claims of the present disclosure.

What is claimed is:

1. A top-emission type organic light emitting display device, comprising:

a substrate having a display area and a non-display area;

a thin film transistor on the display area, the thin film transistor including an active layer, a gate electrode, a source electrode, and a drain electrode;

an organic light emitting element on the display area, the organic light emitting element including an anode, an organic light emitting layer, and a cathode;

a first voltage supply wire on the non-display area;

a second voltage supply wire on the non-display area and disposed over the first voltage supply wire of the non-display area, the second voltage supply wire and the first voltage supply wire having at least one overlapping region; and an anti-burning layer in the at least one overlapping region disposed between the first voltage supply wire and the second voltage supply wire, wherein the anti-burning layer is an insulation layer with a same thickness as a distance between the first voltage supply wire and the second voltage supply wire to prevent burning the at least one overlapping region, wherein one of the first voltage supply wire and the second voltage supply wire is a Vss-voltage supply wire and the other one of the first voltage supply wire and the second voltage supply wire is a Vdd-voltage supply wire.

2. The device of claim 1, wherein one of the first voltage supply wire and the second voltage supply wire is made of a same material as the gate electrode and the other one of the first voltage supply wire and the second voltage supply wire is made of a same material as the anode.

3. The device of claim 1, wherein the distance between the first voltage supply wire and the second voltage supply wire is 4 µm or larger.

4. The device of claim 1, wherein the anti-burning layer includes one or more of a first insulation layer made of a same material as an interlayer insulation layer, a second insulation layer made of a same material as a passivation layer, and a first over-coating layer to provide a planar cover for the first voltage supply wire.

5. The device of claim 4, wherein the first over-coating layer is made of one or more of polyacrylate resin, epoxy resin, phenolic resin, polyamide resin, polyimide resin, unsaturated polyester resin, poly-phenylenether resin, poly-phenylenesulfide resin, and benzocyclobutene.

6. The device of claim 4, wherein the anti-burning layer further comprises a second over-coating layer disposed between the first over-coating layer and the second voltage supply wire, the second over-coating layer made of a same material as the first over-coating layer.

7. A top-emission type organic light emitting display device, comprising:

a substrate having a display area and a non-display area;

a thin film transistor on the display area, the thin film transistor including an active layer, a gate electrode, a source electrode, and a drain electrode;

an organic light emitting element on the display area, the organic light emitting element including an anode, an organic light emitting layer, and a cathode;

a first voltage supply wire on both of the display area and the non-display area;

a second voltage supply wire, the first voltage supply wire and the second voltage supply wire disposed on different layers;

a scan wire on the display area, the scan wire electrically connected with the gate electrode; and a data wire electrically connected with one of the source electrode and the drain electrode, wherein the first voltage supply wire and the second voltage supply wire perpendicularly cross with a vertical gap disposed therebetween, the first voltage supply wire and the second voltage supply wire crossing in a part of the non-display area, wherein the scan wire is made of a material different from the data wire, and the data wire is made of a same material as the source electrode and the drain electrode.

8. The device of claim 7, wherein one of the first voltage supply wire and the second voltage supply wire is a Vss-voltage supply wire and the other one of the first voltage supply wire and the second voltage supply wire is a Vdd-voltage supply wire.

9. The device of claim 8, wherein the Vss-voltage supply wire is made of a same material as one of the gate electrode and the anode.

10. The device of claim 8, wherein the Vdd-voltage supply wire has a first portion made of a same material as one of the gate electrode and the anode, and a second portion made of a same material as the source electrode and the drain electrode.

11. The device of claim 10, wherein the Vdd-voltage supply wire has two layers respectively made of different materials in a part of the non-display area, wherein the two layers are electrically connected to each other via a contact hole.

12. The device of claim 7, further comprising a pad element including a first pad unit electrically connected with the first voltage supply wire and a second pad unit electrically connected with the second voltage supply wire, wherein each of the first pad unit and the second pad unit has a plurality of stacked layers, wherein an uppermost layer of the stacked layers of the first pad unit and an uppermost layer of the stacked layer of the second pad unit are made of a same material as the anode.

13. The device of claim 12, wherein each of the first voltage supply wire and the second voltage supply wire comprises a stem wire, one or more branch wires branched from the stem wire, and a connection wire electrically connecting the stem wire and the pad element.

14. The device of claim 13, wherein each of the stem wires of the first and second voltage supply wires is formed in the non-display area, and wherein the branch wires of the first voltage supply wire and the branch wires of the second voltage supply wire are formed in both of the display area and the non-display area.

15. The device of claim 13, wherein the stem wire of the first voltage supply wire overlaps the branch wires of the second voltage supply wire.

16. The device of claim 7, further comprising:

an anti-burning layer in the part of the non-display area disposed between the first voltage supply wire and the second voltage supply wire.

17. The device of claim 16, wherein the anti-burning layer is an insulation layer with a same thickness as the vertical gap between the first voltage supply wire and the second voltage supply wire to prevent burning in the part of the non-display.

18. The device of claim 16, wherein the vertical gap is 4 µm or larger.

19. The device of claim 16, wherein the anti-burning layer includes one or more of a first insulation layer made of a same material as an interlayer insulation layer, a second insulation layer made of a same material as a passivation layer, and a first over-coating layer to provide a planar cover for the first voltage supply wire.

20. The device of claim 19, wherein the first over-coating layer is made of one or more of polyacrylate resin, epoxy resin, phenolic resin, polyamide resin, polyimide resin, unsaturated polyester resin, poly-phenylenether resin, poly-phenylenesulfide resin, and benzocyclobutene.

21. The device of claim 16, wherein the anti-burning layer further comprises a second over-coating layer disposed between the first over-coating layer and the second voltage supply wire, the second over-coating layer made of a same material as the first over-coating layer.

* * * * *